United States Patent
Nakamura et al.

[11] Patent Number: 5,811,375
[45] Date of Patent: Sep. 22, 1998

[54] SUPERCONDUCTING MULTILAYER INTERCONNECTION FORMED OF OXIDE SUPERCONDUCTOR MATERIAL AND METHOD FOR MANUFACTURING THE SAME

[75] Inventors: Takao Nakamura; Hiroshi Inada; Michitomo Iiyama, all of Osaka, Japan

[73] Assignee: Sumitomo Electric Industries Ltd., Osaka, Japan

[21] Appl. No.: 497,233

[22] Filed: Jun. 30, 1995

Related U.S. Application Data

[62] Division of Ser. No. 983,431, Dec. 2, 1992, Pat. No. 5,430,012.

[30] Foreign Application Priority Data

| Dec. 2, 1991 | [JP] | Japan | 3-343940 |
| Dec. 3, 1991 | [JP] | Japan | 3-347845 |
| Dec. 10, 1991 | [JP] | Japan | 3-350185 |
| Nov. 13, 1992 | [JP] | Japan | 4-328917 |

[51] Int. Cl.⁶ ......... H01L 39/06
[52] U.S. Cl. ......... 505/413; 505/329; 505/475; 117/94; 117/106; 117/947
[58] Field of Search ......... 117/94, 106, 947; 505/329, 413, 475

[56] References Cited

U.S. PATENT DOCUMENTS

| 4,980,338 | 12/1990 | Yamazaki | 505/413 |
| 5,354,734 | 10/1994 | Tanaka et al. | 505/329 |
| 5,366,953 | 11/1994 | Chor et al. | 505/329 |
| 5,430,012 | 7/1995 | Nakamura et al. | 505/234 |
| 5,567,674 | 10/1996 | Inoda et al. | 505/329 |

FOREIGN PATENT DOCUMENTS

| 03183207 | 7/1993 | Japan | 505/413 |

*Primary Examiner*—Robert Kunemund
*Attorney, Agent, or Firm*—Kerkam, Stowell, Kondracki & Clarke, P.C.; John C. Kerins

[57] ABSTRACT

A superconducting multilayer interconnection comprises a substrate having a principal surface, a first superconducting current path of a c-axis orientated oxide superconductor thin film formed on the principal surface of the substrate, an insulating layer on the first superconducting current path, and a second superconducting current path of a c-axis orientated oxide superconductor thin film formed on the insulating layer so that the first and second superconducting current paths are insulated by the insulating layer. The superconducting multilayer interconnection further comprises a superconducting interconnect current path of an a-axis orientated oxide superconductor thin film, through which the first and second superconducting current paths are electrically connected each other. In the superconducting multilayer interconnection, at least one of the first and second superconducting current paths has a step portion and the superconducting interconnect current path is positioned at the step portion so that the interface area between the superconducting current path and the superconducting interconnect current path is enlarged.

3 Claims, 5 Drawing Sheets

5 SUBSTRATE

1 OXIDE SUPERCONDUCTOR THIN FILM
5 SUBSTRATE

2 INSULATOR FILM
1 OXIDE SUPERCONDUCTOR THIN FILM
5 SUBSTRATE

SUPERCONDUCTING MULTILAYER INTERCONNECTION FORMED OF OXIDE SUPERCONDUCTOR MATERIAL AND METHOD FOR MANUFACTURING THE SAME

This is a division of application Ser. No. 07/983,431 filed Dec. 2, 1992 now U.S. Pat. No. 5,430,012.

BACKGROUND OF THE INVENTION

1. Field of the Invention

The present invention relates to a multilayer interconnection and method for manufacturing the multilayer interconnection. More specifically to a multilayer interconnection formed of oxide superconductor material and method for manufacturing the same.

2. Description of Related Art

A superconducting current path is one of the electronic applications of a superconductor. If all the current paths of a conventional electronic circuit including semiconductor devices is replaced with superconducting current paths, completely, the electronic circuit will operate rapidly with low power consumption. Superconducting signal paths are also expected to reduce the wave form distortion so that the required number of amplifiers and/or repeaters can be reduced. Particularly, by using an oxide superconductor material which has been recently advanced in study, it is possible to produce a superconducting current path through which superconducting current flows at relatively high temperature.

An oxide superconductor has the largest critical current density $J_c$ in direction perpendicular to c-axes of its crystal lattices. Therefore, it is desirable that the superconducting current path through which superconducting current flows horizontally is formed of a c-axis orientated oxide superconductor thin film and the superconducting path through which superconducting current flows vertically is formed of oxide superconductor thin films of which c-axes are orientated horizontally. In this specification, this oxide superconductor thin film of which c-axes are orientated horizontally will be called an "a-axis orientated oxide superconductor thin film".

In a prior art, a superconducting multilayer interconnection which has layered superconducting current paths constituted of c-axis orientated oxide superconductor thin films and a superconducting interconnect current path constituted of an a-axis orientated oxide superconductor thin film is proposed. In the superconducting multilayer interconnection, the superconducting interconnect current path is formed at a via hole penetrating through the layered superconducting current paths. The via hole increases the occupied area of the superconducting multilayer interconnection.

In addition, grain boundaries are generated at the interface between the c-axis orientated oxide superconductor thin film and the a-axis orientated oxide superconductor thin film, which introduce difficulties of superconducting current flowing. The grain boundaries sometimes form Josephson junctions which pass only tunnel current so that the current capability is limited and the input and output characteristics become nonlinear. Even if no Josephson junction is formed at the interface, Joule heat may be generated by the electrical resistance formed at the interface, which causes the "quench" phenomenon. Furthermore, the c-axis orientated oxide superconductor thin film and the a-axis orientated oxide superconductor thin film may interfere with each other so as to degrade each other.

In order to manufacture the above superconducting multilayer interconnection, in a prior art, the via hole is formed through layered superconducting current paths and insulating layers and an a-axis orientated oxide superconductor thin film is formed in the via hole. The diameter of the via hole is made small in order to decrease the occupied area of the superconducting multilayer interconnection. Therefore, the side surface of the via hole can not be cleaned enough, which generates an unnecessary Josephson junction when the a-axis orientated oxide superconductor thin film is formed.

SUMMARY OF THE INVENTION

Accordingly, it is an object of the present invention to provide a superconducting multilayer interconnection of an oxide superconductor, which have overcome the above mentioned defects of the conventional ones.

Another object of the present invention is to provide a superconducting multilayer interconnection integrated with elementary devices, which have overcome the above mentioned defects of the conventional ones.

Still another object of the present invention is to provide a method of manufacturing the superconducting multilayer interconnection, which have overcome the above mentioned defects of the conventional ones.

The above and other objects of the present invention are achieved in accordance with the present invention by a superconducting multilayer interconnection comprising a substrate having a principal surface, a first superconducting current path of a c-axis orientated oxide superconductor thin film formed on the principal surface of the substrate, an insulating layer on the first superconducting current path, a second superconducting current path of a c-axis orientated oxide superconductor thin film formed on the insulating layer so that the first and second superconducting current paths are insulated by the insulating layer, and a superconducting interconnect current path of an a-axis orientated oxide superconductor thin film, through which the first and second superconducting current paths are electrically connected each other in which at least one of the first and second superconducting current paths has a step portion and the superconducting interconnect current path is positioned at the step portion so that the interface area between the superconducting current path and the superconducting interconnect current path is enlarged.

In the superconducting multilayer interconnection, the interface between the superconducting current path and the superconducting interconnect current path is preferably inclined so as to enlarge the contact area.

In one preferred embodiment, the substrate has a step on the principal surface so that the first and second superconducting current path have step portions on the step of the substrate, and the superconducting interconnect current path is positioned on the step of the substrate. Namely, the superconducting current paths and insulating layers are stacked on the principal surface of the substrate having a step so that each of them also has a step at the step of the substrate.

In another preferred embodiment, the superconducting interconnect current path includes an insulating layer formed of an a-axis orientated $Pr_1Ba_2Cu_3O_{7-\epsilon}$ oxide thin film.

In a preferred embodiment, the oxide superconductor is formed of high-$T_c$ (high critical temperature) oxide superconductor, particularly, formed of a high-$T_c$ copper-oxide type compound oxide superconductor for example a Y—Ba—Cu—O compound oxide superconductor material and a Bi—Sr—Ca—Cu—O compound oxide superconductor material.

In addition, the substrate can be formed of an insulating substrate, preferably an oxide single crystalline substrate such as MgO, SrTiO$_3$, CdNdAlO$_4$, etc. These substrate materials are very effective in forming or growing a crystalline film having a high degree of crystalline orientation.

According to another aspect of the present invention, there is provided a superconducting multilayer interconnection comprising a substrate having a principal surface, a first superconducting current path of a c-axis orientated oxide superconductor thin film formed on the principal surface of the substrate, an insulating layer on the first superconducting current path, a second superconducting current path of a c-axis orientated oxide superconductor thin film formed on the insulating layer so that the first and second superconducting current paths are insulated by the insulating layer, and an interconnect current path through which the first and second superconducting current paths are electrically connected each other, which is constituted of two noble metal layers and a resistor layer inserted between the noble metal layers.

In this case, the occupied area of the superconducting multilayer interconnection can be reduced so that it is desirable to apply it to an integrated circuit.

According to still another aspect of the present invention, there is provided a method for manufacturing a superconducting multilayer interconnection comprising the steps of forming a seed layer on which an a-axis orientated oxide superconductor thin film grows under a condition of growing c-axis orientated oxide superconductor thin film at a portion of a principal surface of a substrate, on which superconducting interconnect current path will be positioned, forming a first oxide superconductor thin film under a condition of growing c-axis orientated oxide superconductor thin film on the principal surface of the substrate so that an a-axis orientated oxide superconductor thin film grows on the seed layer, processing the first oxide superconductor thin film so as to form a first superconducting current path, depositing an insulating layer on the first superconducting current path, pattern-etching the insulating layer so that the a-axis orientated oxide superconductor thin film is exposed and the first superconducting current path is not exposed, forming a second oxide superconductor thin film under a condition of growing c-axis orientated oxide superconductor thin film on the insulating layer so that an a-axis orientated oxide superconductor thin film grows on the exposed a-axis orientated oxide superconductor thin film and processing the second oxide superconductor thin film so as to form a second superconducting current path which is electrically connected to the first superconducting current path through a superconducting interconnect current path formed of the a-axis orientated oxide superconductor thin films on the seed layer.

The seed layer can be formed of an a-axis orientated oxide superconductor thin film or an a-axis orientated Pr$_1$Ba$_2$Cu$_3$O$_{7-\epsilon}$ oxide thin film. An insulating layer can be formed in the superconducting interconnect current path by using an a-axis orientated Pr$_1$Ba$_2$Cu$_3$O$_{7-\epsilon}$ oxide thin film.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1F, a method for manufacturing an embodiment of the the superconducting multilayer interconnection in accordance with the present invention will be described.

Figure 1A:
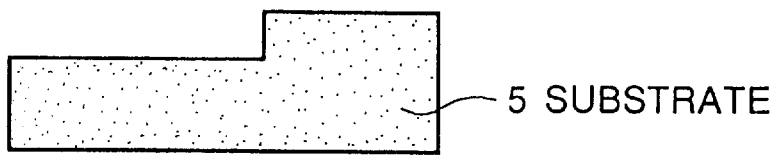
FIGS. 1A to 1F are diagrammatic sectional views for illustrating a method for manufacturing a first embodiment of the superconducting multilayer interconnection in accordance with the present invention.

As shown in FIG. 1A, an MgO substrate 5 having a step on a principal surface is prepared. The step can be formed by an etching process. A superconducting interconnect current path will be formed at the step portion.

Figure 1B:
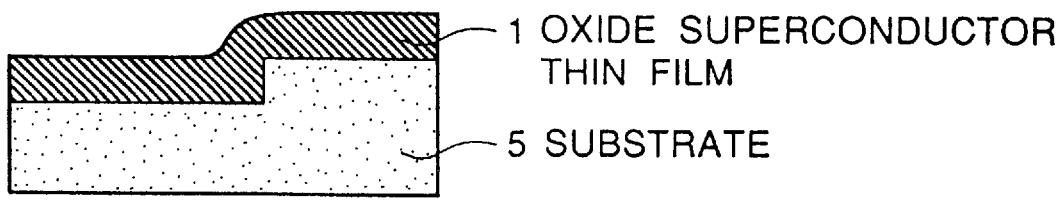

As shown in FIG. 1B, a c-axis orientated Y$_1$Ba$_2$Cu$_3$O$_{7-\delta}$ oxide superconductor thin film 1 is formed on the principal surface of the substrate 5 by a sputtering. The c-axis orientated Y$_1$Ba$_2$Cu$_3$O$_{7-\delta}$ oxide superconductor thin film 1 is preferably formed by a sputtering, particularly off-axis sputtering. The condition of forming the c-axis orientated Y$_1$Ba$_2$Cu$_3$O$_{7-\delta}$ oxide superconductor thin film 1 by off-axis sputtering is as follows:

| Sputtering Gas | |
| --- | --- |
| Ar: | 90% |
| O$_2$: | 10% |
| Total pressure | 5 × 10$^{-2}$ Torr |
| Temperature of the substrate | 700° C. |

The c-axis orientated Y$_1$Ba$_2$Cu$_3$O$_{7-\epsilon}$ oxide superconductor thin film 1 will constitute a superconducting current path through which superconducting current will flow in parallel to the substrate 5 when the superconducting multilayer interconnection will be completed.

Figure 1C:
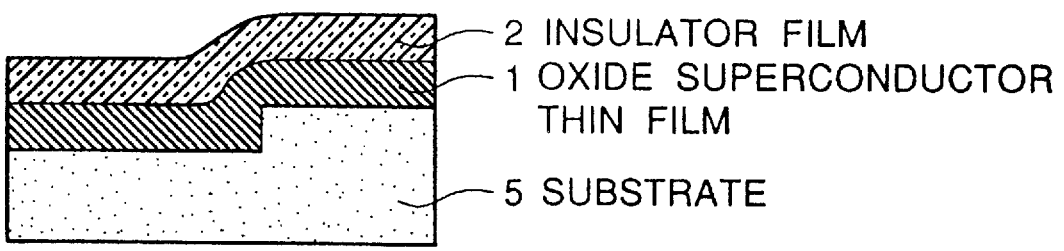

Then, as shown in FIG. 1C, an insulator film 2 of MgO, silicon nitride or SrTiO$_3$ is formed on the the c-axis orientated Y$_1$Ba$_2$Cu$_3$O$_{7-\delta}$ oxide superconductor thin film 1. The insulator film 2 is preferably formed by a sputtering or CVD.

Figure 1D:
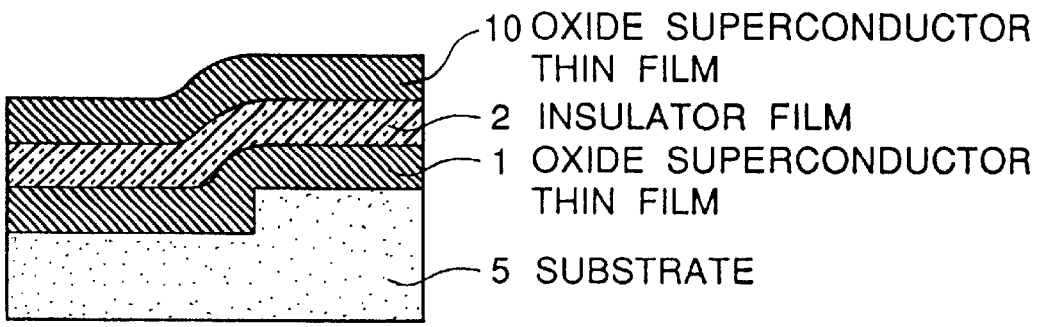

Thereafter, as shown in FIG. 1D, a second c-axis orientated Y$_1$Ba$_2$Cu$_3$O$_{7-\delta}$ oxide superconductor thin film 10 which will be an upper layer superconducting current path through which superconducting current will flow horizontally is formed by an off-axis sputtering. The condition of forming the c-axis orientated Y$_1$Ba$_2$Cu$_3$O$_{7-\delta}$ oxide superconductor thin film 10 is the same as that of the c-axis orientated Y$_1$Ba$_2$Cu$_3$O$_{7-\delta}$ oxide superconductor thin film 1.

Figure 1E:
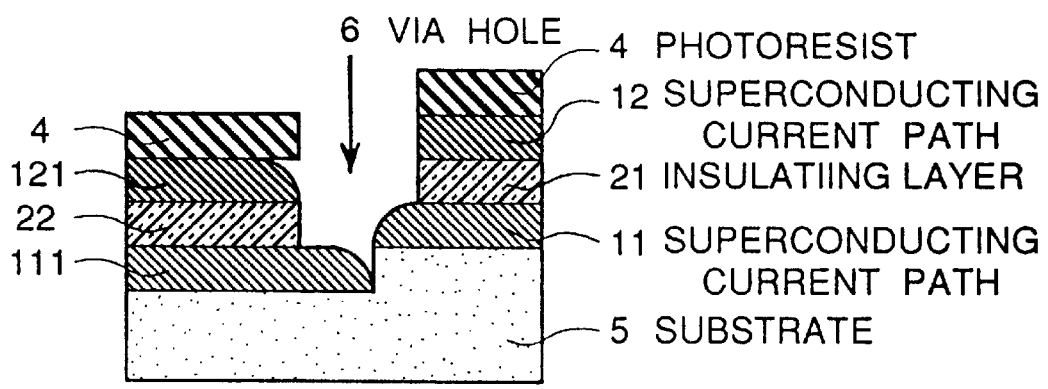

Then, as shown in FIG. 1E, photoresist layers 4 is formed on the c-axis orientated Y$_1$Ba$_2$Cu$_3$O$_{7-\delta}$ oxide superconductor thin film 10 excluding the step portion and the stacked structure including the c-axis orientated Y$_1$Ba$_2$Cu$_3$O$_{7-\delta}$ oxide superconductor thin films 1 and 10 and the insulator film 2 are etched by HCl having a concentration of 0.1% so that a via hole 6 is formed and the substrate 5 is exposed at the step portion.

Since the crystalline structures of the c-axis orientated Y$_1$Ba$_2$Cu$_3$O$_{7-\delta}$ oxide superconductor thin films 1 and 10 are disordered and have thin thickness at the step portions, their step portions are easily etched and the etched surfaces become inclined.

The c-axis orientated $Y_1Ba_2Cu_3O_{7-\delta}$ oxide superconductor thin films 1 and 10 and the insulator film 2 are separated into lower layer superconducting current paths 11, 111 and upper layer superconducting current paths 12, 121 and insulating layers 21, 22 by the via hole 6.

Then, the photoresist layers 4 are removed and the substrate 5 is heated to a temperature of 350° to 400° C. under a high vacuum of on the order of $1\times10^{-10}$ Torr in order to clean the etched surfaces.

Figure 1F:
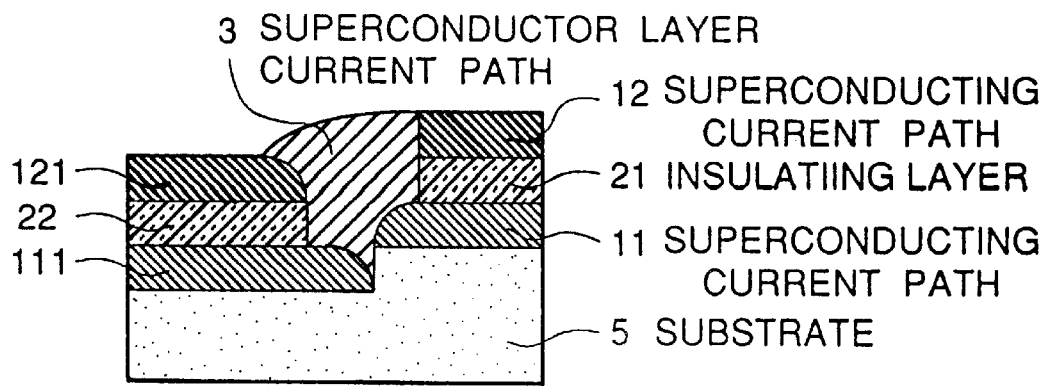

Finally, as shown in FIG. 1F, a superconducting interconnect current path 3 of an a-axis orientated $Y_1Ba_2Cu_3O_{7-\delta}$ oxide superconductor thin film is formed at the via hole 6 by an off-axis sputtering. The condition of forming the a-axis orientated $Y_1Ba_2Cu_3O_{7-\delta}$ oxide superconductor thin film by off-axis sputtering is as follows:

| Sputtering Gas | |
| --- | --- |
| Ar: | 90% |
| $O_2$: | 10% |
| Total pressure | $5 \times 10^{-2}$ Torr |
| Temperature of the substrate | 640° C. |

Unnecessary a-axis orientated $Y_1Ba_2Cu_3O_{7-\delta}$ oxide superconductor thin film is removed if necessary. Then, the superconducting multilayer interconnection in accordance with the present invention is completed.

The above mentioned superconducting multilayer interconnection in accordance with the present invention has inclined interfaces between horizontal superconducting current paths of c-axis orientated oxide superconductor thin films and a superconducting interconnect current path of a a-axis orientated oxide superconductor thin film. Therefore, the contact area is large and there is no grain boundary at the oxide superconductor interfaces. By this, the current capability and characteristics of the superconducting path can be improved. The superconducting multilayer interconnection showed superconductivity at the temperature of 85K and no abnormality was detected at the interfaces between the horizontal superconducting current paths and the vertical superconducting current path.

Embodiment 2

Referring to FIGS. 2A to 2I, a process for manufacturing an embodiment of the superconducting multilayer interconnection in accordance with the present invention will be described.

Figure 2A:
FIGS. 2A to 2I are diagrammatic sectional views for illustrating a method for manufacturing a second embodiment of the superconducting multilayer interconnection in accordance with the present invention.

As shown in FIG. 2A, there is prepared an MgO substrate 5 which has a substantially planar principal surface.

Figure 2B:
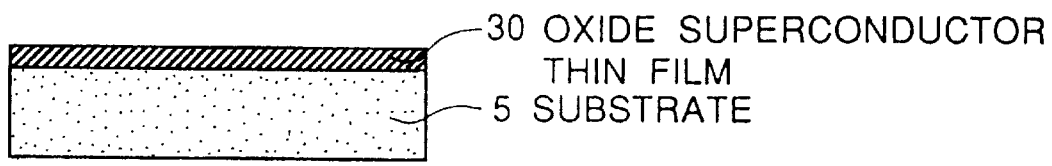

As shown in FIG. 2B, an a-axis orientated $Y_1Ba_2Cu_3O_{7-\delta}$ oxide superconductor thin film 30 having a thickness of 50 to 100 nanometers is formed on a principal surface of the substrate 5 by a sputtering. The a-axis orientated $Y_1Ba_2Cu_3O_{7-\delta}$ oxide superconductor thin film 30 is preferably formed by a sputtering, particularly off-axis sputtering. The condition of forming the a-axis orientated $Y_1Ba_2Cu_3O_{7-\delta}$ oxide superconductor thin film 30 by off-axis sputtering is as follows:

| Sputtering Gas | |
| --- | --- |
| Ar: | 90% |
| $O_2$: | 10% |
| Total pressure | $5 \times 10^{-2}$ Torr |
| Temperature of the substrate | 635° C. |

The a-axis orientated $Y_1Ba_2Cu_3O_{7-\delta}$ oxide superconductor thin film 30 will be seeds of superconducting interconnect current paths.

Figure 2C:
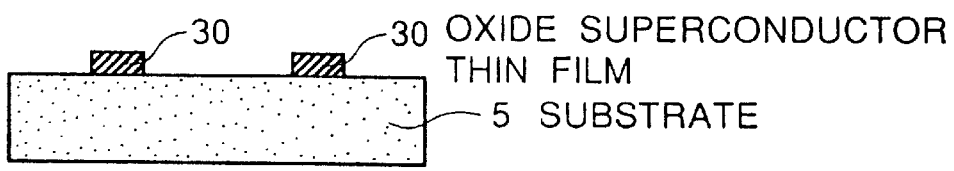

Then, as shown in FIG. 2C, the a-axis orientated $Y_1Ba_2Cu_3O_{7-\delta}$ oxide superconductor thin film 30 is removed completely so that the principal surface of the substrate 5 is exposed excluding portions on which superconducting interconnect current paths will be positioned. Then, the substrate 5 is heated to a temperature of 350° to 400° C. under a high vacuum of on the order of $1\times10^{-10}$ Torr in order to clean the exposed surface of the substrate 5. This heat-treatment is not necessary, if the exposed surface of the substrate 5 is clean enough.

Figure 2D:
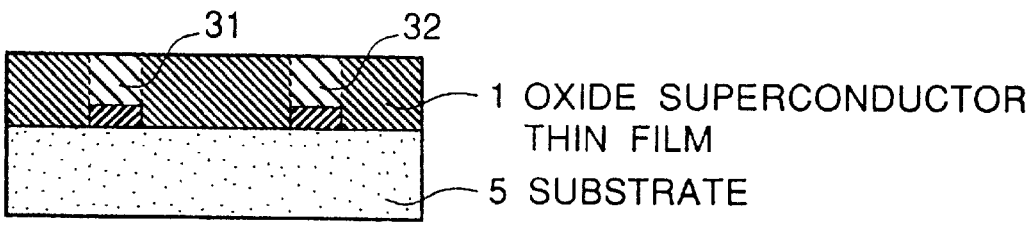

Thereafter, as shown in FIG. 2D, a $Y_1Ba_2Cu_3O_{7-\delta}$ oxide superconductor thin film 1 having a thickness of 200 to 300 nanometers is deposited on the principal surface of the substrate 5 preferably by an off-axis sputtering. The condition of forming the $Y_1Ba_2Cu_3O_{7-\delta}$ oxide superconductor thin film 1 by off-axis sputtering is as follows:

| Sputtering Gas | |
| --- | --- |
| Ar: | 90% |
| $O_2$: | 10% |
| Total pressure | $5 \times 10^{-2}$ Torr |
| Temperature of the substrate | 700° C. |

The above sputtering condition is suitable for forming a c-axis orientated $Y_1Ba_2Cu_3O_{7-\delta}$ oxide superconductor thin film. However, a-axis orientated $Y_1Ba_2Cu_3O_{7-\delta}$ oxide superconductor thin films 31 and 32 grow on the remained a-axis orientated $Y_1Ba_2Cu_3O_{7-\delta}$ oxide superconductor thin films 30. The rest portion of the $Y_1Ba_2Cu_3O_{7-\delta}$ oxide superconductor thin film 1 is c-axis orientated.

The c-axis orientated $Y_1Ba_2Cu_3O_{7-\delta}$ oxide superconductor thin film 1 will constitute a lower superconducting current path and the a-axis orientated $Y_1Ba_2Cu_3O_{7-\delta}$ oxide superconductor thin films 31, and 32 will constitute superconducting interconnect current paths.

Figure 2E:
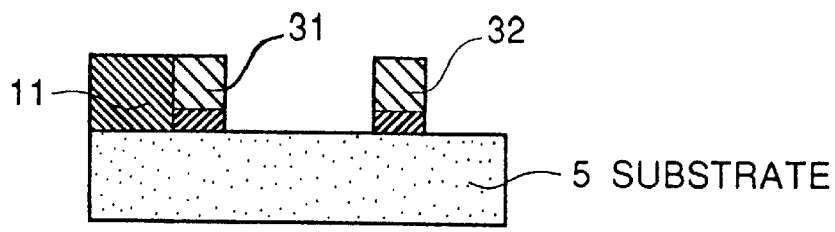
Figure 2F:
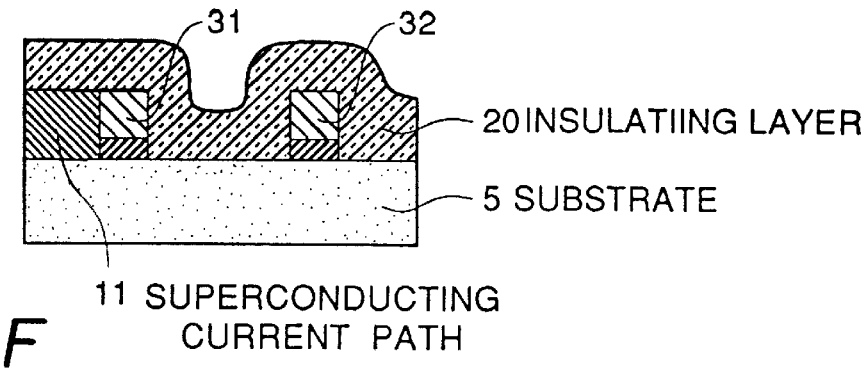

Then, the c-axis orientated $Y_1Ba_2Cu_3O_{7-\delta}$ oxide superconductor thin film 1 is selectively removed so that a lower superconducting current path 11 is formed on the substrate 5, as shown in FIG. 2E. Thereafter, an insulating layer 20 of $SrTiO_3$, silicon nitride or MgO is formed over the substrate 5, the superconducting current path 11 and the a-axis orientated $Y_1Ba_2Cu_3O_{7-\delta}$ oxide superconductor thin films 31 and 32, as shown in FIG. 2F.

Figure 2G:
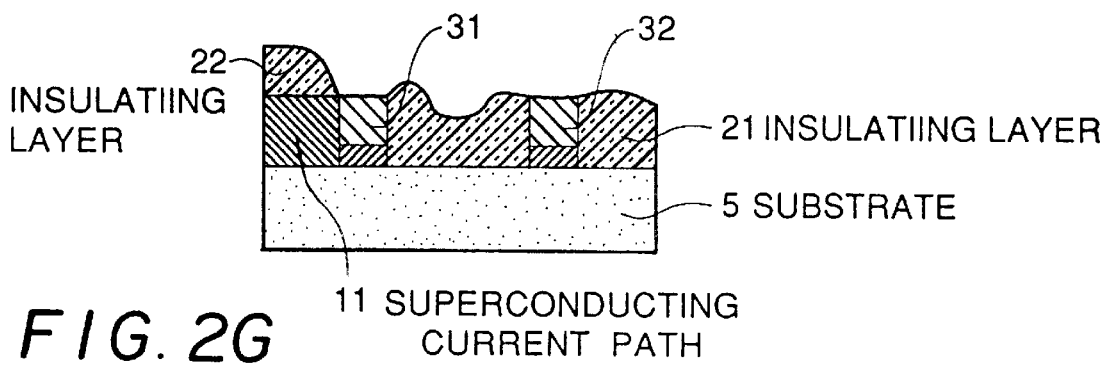

The insulating layer 20 is pattern-etched so that the a-axis orientated $Y_1Ba_2Cu_3O_{7-\delta}$ oxide superconductor thin films 31 and 32 are exposed on the surface and insulating layers 21 and 22 are formed, as shown FIG. 2G.

Figure 2H:
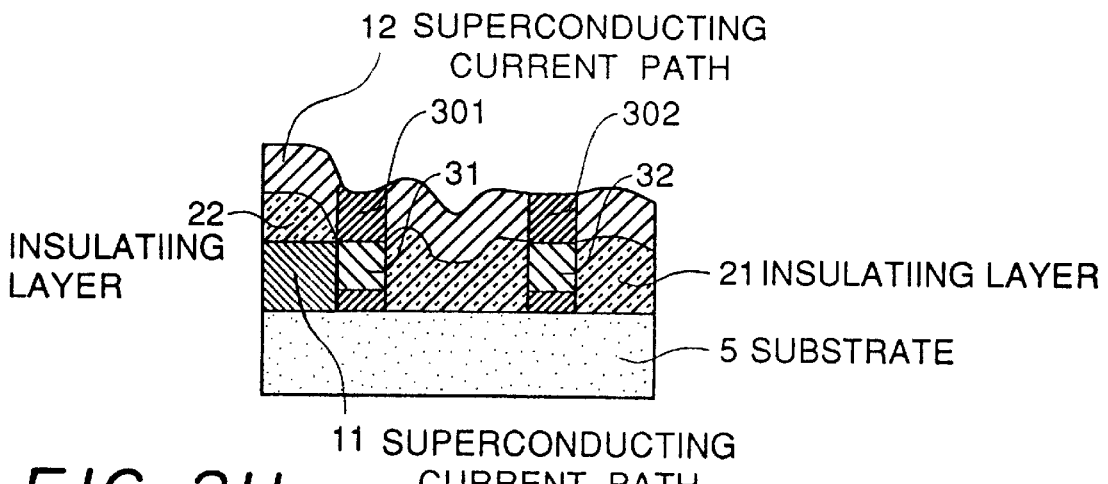

Finally, as shown in FIG. 2H, a $Y_1Ba_2Cu_3O_{7-\delta}$ oxide superconductor thin film which constitutes an upper superconducting current path 12 is deposited over the insulating layers 21 and 22. The $Y_1Ba_2Cu_3O_{7-\delta}$ oxide superconductor thin film 12 is formed under the same condition as that of the $Y_1Ba_2Cu_3O_{7-\delta}$ oxide superconductor thin film 1. Then, the superconducting multilayer interconnection in accordance with the second embodiment of present invention is completed.

So as the $Y_1Ba_2Cu_3O_{7-\delta}$ oxide superconductor thin film 1, a-axis orientated $Y_1Ba_2Cu_3O_{7-\delta}$ oxide superconductor thin films 301 and 302 grow on the a-axis orientated $Y_1Ba_2Cu_3O_{7-\delta}$ oxide superconductor thin films 31 and 32. The rest portion of the $Y_1Ba_2Cu_3O_{7-\delta}$ oxide superconductor thin film 12 is c-axis orientated.

Figure 2I:
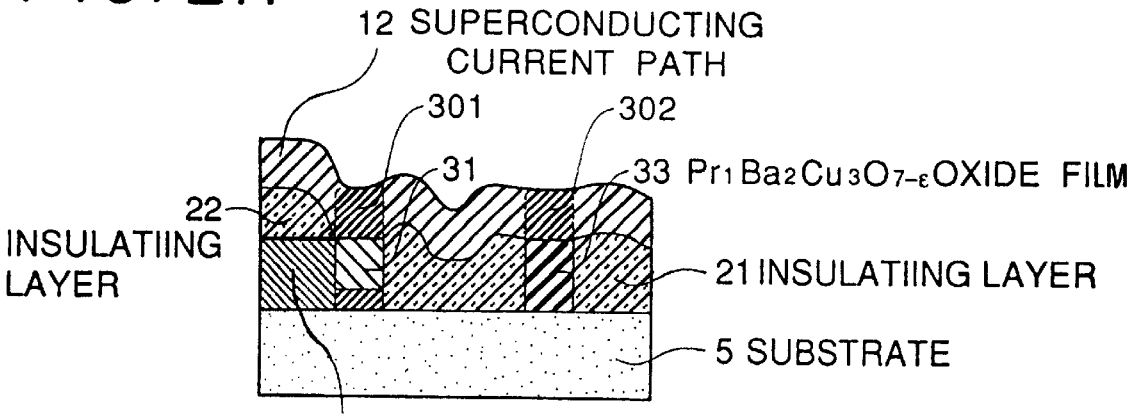

The a-axis orientated $Y_1Ba_2Cu_3O_{7-\delta}$ oxide superconductor thin films 31 and 301 constitutes a first superconducting interconnect current path which connects the lower superconducting current path 11 to the upper superconducting current path 12 of the $Y_1Ba_2Cu_3O_{7-\delta}$ oxide superconductor thin film. The a-axis orientated $Y_1Ba_2Cu_3O_{7-\delta}$ oxide superconductor thin films 32 and 302 constitutes a second superconducting interconnect current path, The superconducting interconnect current paths of the above superconducting multilayer interconnection extend to whole thickness of the superconducting multilayer interconnection. In this connection, in order to form a superconducting interconnect current path which does not extend to whole thickness of the superconducting multilayer interconnection, an a-axis orientated $Pr_1Ba_2Cu_3O_{7-\epsilon}$ oxide thin film is preferably used for an insulator. Namely, as shown in FIG. 2I, an unnecessary portion 33 of the superconducting interconnect current path is constituted of an a-axis orientated $Pr_1Ba_2Cu_3O_{7-\epsilon}$ oxide thin film. $Pr_1Ba_2Cu_3O_{7-\epsilon}$ is an oxide of high resistance and the crystalline structure is similar to $Y_1Ba_2Cu_3O_{7-\delta}$ oxide superconductor. In addition, an a-axis orientated $Pr_1Ba_2Cu_3O_{7-\epsilon}$ oxide thin film can be formed by a sputtering under a condition similar to that of an a-axis orientated $Y_1Ba_2Cu_3O_{7-\delta}$ oxide superconductor thin film.

Therefore, in order to form the superconducting multilayer interconnection shown in FIG. 2I, an a-axis orientated $Pr_1Ba_2Cu_3O_{7-\epsilon}$ oxide thin film is formed on a portion of the substrate 5 instead of the a-axis orientated $Y_1Ba_2Cu_3O_{7-\delta}$ oxide superconductor thin film 30 in the process shown in FIG. 2C.

The superconducting multilayer interconnection showed superconductivity at the temperature of 85K and no abnormality was detected at the interfaces between the horizontal superconducting current paths and the vertical superconducting current path.

Embodiment 3

Figure 3:
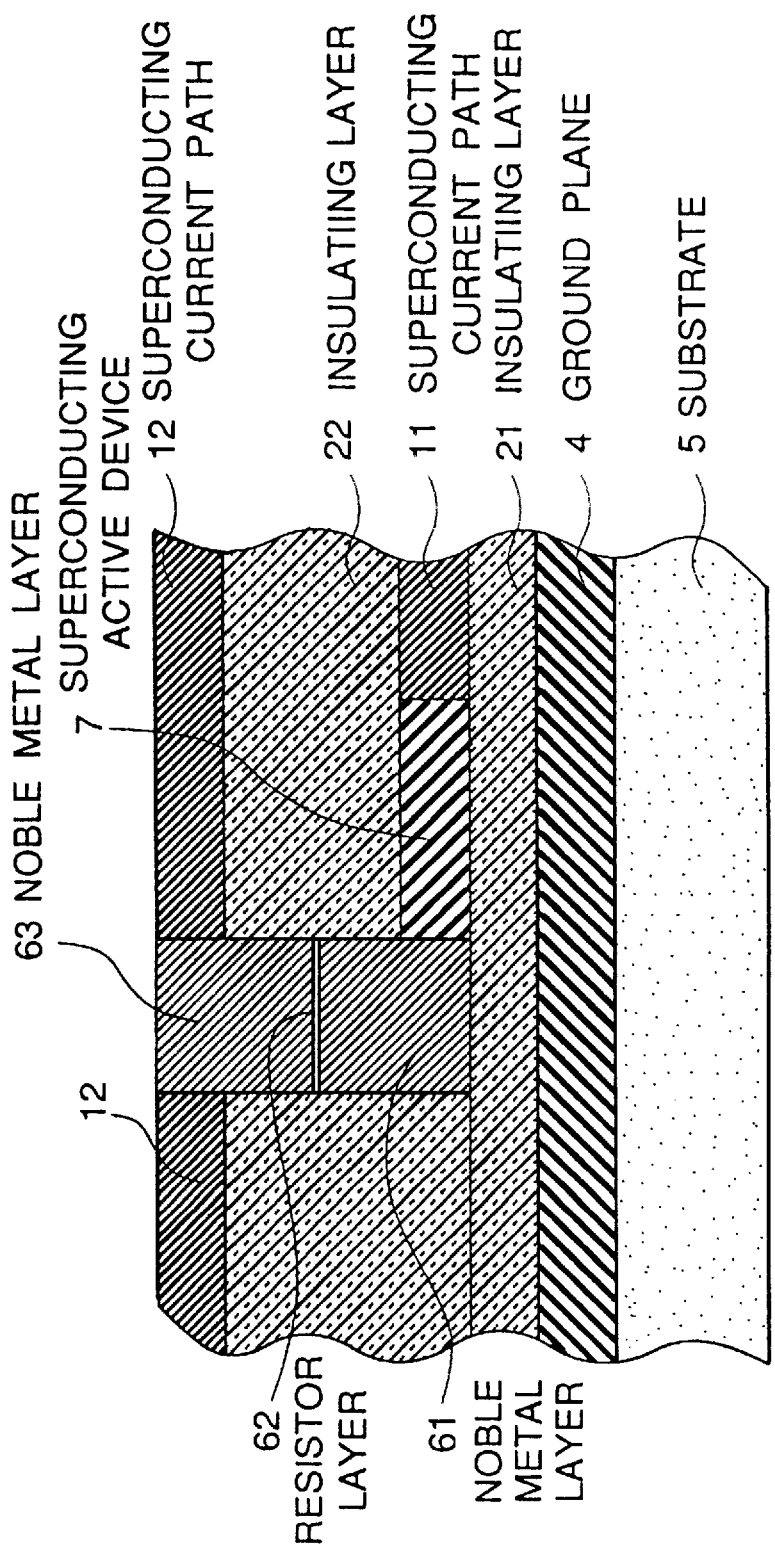
FIG. 3 is a diagrammatic sectional view of a third embodiment of the superconducting multilayer interconnection in accordance with the present invention.

FIG. 3 shows another preferred embodiment of the superconducting multilayer interconnection in accordance with the present invention, which is integrated with a resistor and a superconducting active device.

The superconducting multilayer interconnection includes a ground plane 4 formed on a substrate 5, a first insulating layer 21 formed on the ground plane 4. On the first insulating layer 21, a lower superconducting current path 11, a second insulating layer 22 and an upper superconducting current path 12 are stacked in the named order. A superconducting active device 7, for example a superconducting field effect device, is arranged at an end of the superconducting current path 11.

The superconducting current paths 11 and 12 are electrically connected through an interconnect current path which is constituted of noble metal layers 61 and 63 and a resistor layer 62 between the noble metal layers 61 and 63. The interconnect current path is combined with a resistor.

The ground plane 4, the superconducting current paths 11 and 12 and the superconducting active device 7 are composed of $Y_1Ba_2Cu_3O_{7-\delta}$ oxide superconductor. The insulating layers 21 and 22 are composed of MgO and the noble metal layers 61 and 63 are composed of Au. The resistor layer 62 is composed of WV. Thickness of the resistor layer 62 determines the value of resistivity of the interconnect current path.

The above superconducting, multilayer interconnection in accordance with the present invention was manufactured by a following process.

At first, the ground plane 4 was formed of $Y_1Ba_2Cu_3O_{7-\delta}$ oxide superconductor thin film on an MgO (100) substrate 5.

Then, the first insulating layer 21 of MgO was formed on the ground plane 4 by sputtering, A $Y_1Ba_2Cu_3O_{7-\delta}$ oxide superconductor thin film which would be the lower superconducting current path 11 was formed of on the first insulating layer 21 by an off-axis sputtering. The condition of the off-axis sputtering was as follows:

| Sputtering Gas | |
| --- | --- |
| Ar: | 90% |
| $O_2$: | 10% |
| Total pressure | $5 \times 10^{-2}$ Torr |
| Temperature of the substrate | 700° C. |
| Thickness of the thin film | 400 nanometers |

The $Y_1Ba_2Cu_3O_{7-\delta}$ oxide superconductor thin film was processed by a reactive ion etching so as to form the superconducting current path 11. Then, the superconducting active device was formed at an end of the superconducting current path 11.

The second insulating layer 22 of MgO was formed on the superconducting current path 11 and a $Y_1Ba_2Cu_3O_{7-\delta}$ oxide superconductor thin film which would be the upper superconducting current path 12 was formed on the second insulating layer 22. The $Y_1Ba_2Cu_3O_{7-\delta}$ oxide superconductor thin film was formed by an off-axis sputtering under the same condition as that of the superconducting current path 11.

Then, the $Y_1Ba_2Cu_3O_{7-\delta}$ oxide superconductor thin film was processed by a reactive ion etching so as to form the superconducting current path 12.

Thereafter, the superconducting current path 12 was masked by a photoresist excluding a portion at which interconnect current path would be formed. A via hole which penetrated through the superconducting current path 12, the second insulating layer 22 and the superconducting current path 11 was formed by an Ar ion etching. A first Au layer, a W layer and a second Au layer were successively formed in the via hole by a sputtering.

Finally, the photoresist on the superconducting current path 12 was removed and the superconducting multilayer interconnection in accordance with the present invention was completed.

The superconducting multilayer interconnection showed superconductivity at the, temperature of 85K and the superconducting active device 7 operated. No abnormality was detected at the interfaces between the horizontal superconducting current paths and the superconducting interconnect current path.

In the above mentioned embodiments, the oxide superconductor thin film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material.

The invention has thus been shown and described wide reference to the specific embodiments. However, it should be noted that the present invention is in no way limited to the details of the illustrated structures but converts and modifications may be made within the scope of the appended claims.

We claim:

1. A method for manufacturing a superconducting multi-layer interconnection comprising the steps of forming a seed layer on which an a-axis orientated oxide superconductor thin film grows under a condition of growing c-axis orientated oxide superconductor thin film at a portion of a principal surface of a substrate, on which superconducting interconnect current path will be positioned, forming a first oxide superconductor thin film under a condition of growing c-axis orientated oxide superconductor thin film on the principal surface of the substrate so that an a-axis orientated oxide superconductor thin film grows on the seed layer, processing the first oxide superconductor thin film so as to form a first superconducting current path, depositing an insulating layer on the first superconducting current path, pattern-etching the insulating layer so that the a-axis orientated oxide superconductor thin film is exposed and the first superconducting current path is not exposed, forming a second oxide superconductor thin film under a condition of growing c-axis orientated oxide superconductor thin film on the insulating layer so that an a-axis orientated oxide superconductor thin film grows on the exposed a-axis orientated oxide superconductor thin film and processing the second oxide superconductor thin film so as to form a second superconducting current path which is electrically connected to the first superconducting current path through a superconducting interconnect current path formed of the a-axis orientated oxide superconductor thin films on the seed layer.

2. A method claimed in claim 1, wherein the seed layer is formed of an a-axis orientated oxide superconductor thin film.

3. A method claimed in claim 1, wherein the seed layer is formed of an a-axis orientated $Pr_1Ba_2Cu_3O_{7-\epsilon}$ oxide thin film.

* * * * *